April 2, 1957 C. C. CUTLER 2,787,673

INSTANTANEOUS AUTOMATIC GAIN CONTROL FOR PULSE CIRCUITS

Filed Oct. 26, 1951

INVENTOR
C. C. CUTLER
BY George C. Lord
ATTORNEY

United States Patent Office 2,787,673

Patented Apr. 2, 1957

2,787,673

INSTANTANEOUS AUTOMATIC GAIN CONTROL FOR PULSE CIRCUITS

Cassius C. Cutler, Gillette, N. J., assignor to Bell Telephone Laboratories, Incorporated, New York, N. Y., a corporation of New York Application October 26, 1951, Serial No. 253,433

3 Claims. (Cl. 179—171)

This invention relates to automatic gain control circuits and more particularly to gain control circuits for amplifiers for the transmission of periodic pulse signals.

It is often desirable in amplifiers for periodic pulse signals to provide automatic means for varying the gain of the amplifier to provide maximum amplification for desired pulses and to suppress the transmission of undesired noise or other signals during the interpulse intervals. A gain control characteristic of this type is substantially the inverse of the usual automatic gain control characteristic employed in continuous wave amplifiers wherein the gain is increased for input signals of low amplitude and decreased for input signals of large amplitude to maintain a substantially constant output level.

It is an object of the present invention to provide gain control means for periodic pulse amplifiers which will meet the special requirements set forth above. It is a further object of the invention to provide such gain control arrangements for traveling wave tube amplifiers for the transmission of pulses at microwave frequencies.

In accordance with the present invention there is provided a form of instantaneous automatic gain control in which the gain of the amplifier for each pulse is adjusted in response to the amplitude of the immediately preceding pulse and the transmission of signals is substantially prevented during the pulse intervals (the intervals between pulses). In this arrangement the output of the signal amplifier is applied to a pair of impedances having differing input-output characteristics which coincide only at a single amplitude level. The outputs derived from these impedances are combined in phase opposition and the difference is applied, after amplification if necessary and the introduction of additional delay sufficient to make the total delay between the signal applied to the amplifier and the control wave equal to the interpulse interval, to adjust the gain of the signal amplifier.

The above and other features of the invention will be described in detail in connection with the drawings in which.

Figure 1:
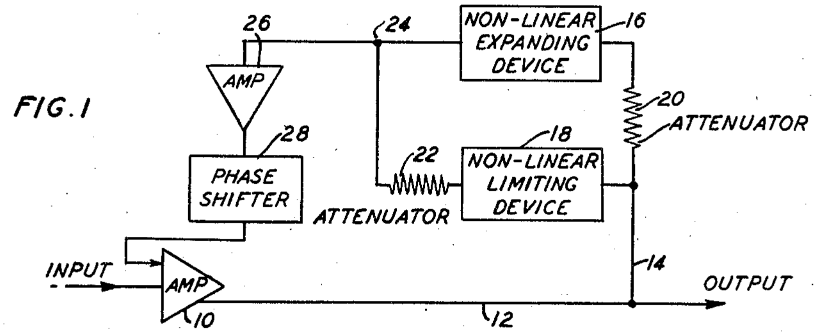
Fig. 1 is a block diagram of an instantaneous automatic gain control circuit according to the invention.

The invention may be understood by reference to the block diagram of Fig. 1 in which the signal amplifier is indicated at 10. This may be any type of amplifier having a frequency response suitable for the intended use and the operating potentials for the amplifier are normally chosen to provide relatively low gain. In accordance with the invention, then, a control voltage is required which is of the proper polarity to increase the gain of the amplifier at the time of the next expected pulse.

In a conventional remote cut-off amplifier, which is normally biased for low gain, a positive control voltage may be applied to the gain control element to increase the gain of the amplifier at the desired time. In order to obtain such a control voltage the output of the amplifier is applied over lead 12 to an output circuit and also over lead 14 to the output of two impedance elements 16 and 18 shown in Fig. 1 as constituting respectively a nonlinear device having an expansion characteristic and a non-linear device having a limiting characteristic. It is to be understood however that impedances 16 and 18 need not necessarily have the particular characteristics indicated in Fig. 1. For example, one of the impedances may have a linear characteristic while the other has a limiting characteristic. One may be a linear detector or rectifier and the other a square law detector. The only requirement is that the two impedances have substantially different input-output characteristics. Attenuators 20 and 22 located respectively in the input connection to impedance 16 and in the output of impedance 18 are provided and are so adjusted to produce equal output potentials at the point 24 from the two impedance devices at a particular signal level. According to the invention, attenuators 20 and 22 and the characteristics of the two impedances are so adjusted as to provide equal output voltages in response to the maximum signal amplitude. As stated above, it is necessary only that the two impedances have substantially different characteristics which however coincide at only one level of applied signals. It will be recognized, therefore, that at any other level of applied signals, the outputs of the two impedance element circuits will be different and when added in opposition will produce a residual output voltage. Preferably the two characteristics or at least the portions thereof employed in the operation of the automatic gain control circuit of the invention should be such as to produce an increasing large difference output as the signal level departs from the maximum. These conditions are met by the expander and limiter characteristics indicated as being employed in the circuit arrangement of Fig. 1. The particular locations of attenuators 20 and 22 shown in Fig. 1 are desirable when the impedance elements 16 and 18 respectively have expanding and limiting characteristics. Under these conditions, attenuator 20 reduces the input level at the expander so that it may operate at greatest efficiency without depriving the limiter of the full signal amplitude. Similarly, attenuator 22 permits adjustment of the limiter output to fall in the desired range. It will be understood that a different arrangement of attenuators may be preferable if the impedance elements have other characteristics.

The outputs from impedances 16 and 18 are combined in phase opposition and the resulting difference voltage is applied to an amplifier 26. This amplifier may have a small band width relative to the band width of the signal amplifier 10 and may have, for example, a band width less than three times the pulse repetition rate thereby to eliminate the transmission of harmonics of this frequency to the gain control element of the signal amplifier.

The operations performed upon the control signals by the circuits thus far described introduce a certain amount of phase delay which in general will not be equal to the pulse interval of the signals applied periodically to signal amplifier 10. Accordingly, the output signal from amplifier 26 is applied to a phase shifter or delay circuit 28 which introduces sufficient delay to make the total delay between the signal applied to amplifier 10 and the control signal applied to control the gain of amplifier 10 substantially equal to the pulse interval.

In the operation of the circuit of Fig. 1, whenever a pulse is received at the input of amplifier 10 it undergoes amplification and appears at the input of the two impedance elements as well as at the output circuit of the signal amplifier. This amplified pulse is then employed to derive a control signal which is applied to the control element of the signal amplifier to provide maximum gain at the approximate time of the next expected pulse of the periodic pulse wave. It will be recalled that the input to amplifier 26 resulting from the action of the non-linear elements 16 and 18 is at the minimum for maximum amplitude of the output of signal amplifier 10. This may be made of the proper characteristics for the required control voltage by phase inversion in amplifier 26. Thus for maximum signal amplitude of the output of amplifier 10, the control voltage at the output of amplifier 26 is at its maximum value and may be applied after an appropriate phase delay introduced by phase shifter 28 to increase the gain of amplifier 10 for the next pulse. Thereafter maximum gain is available at the time of arrival of the pulses of a periodic pulse train and the amplification of noise signals between these times is suppressed.

Figures 2, 3:
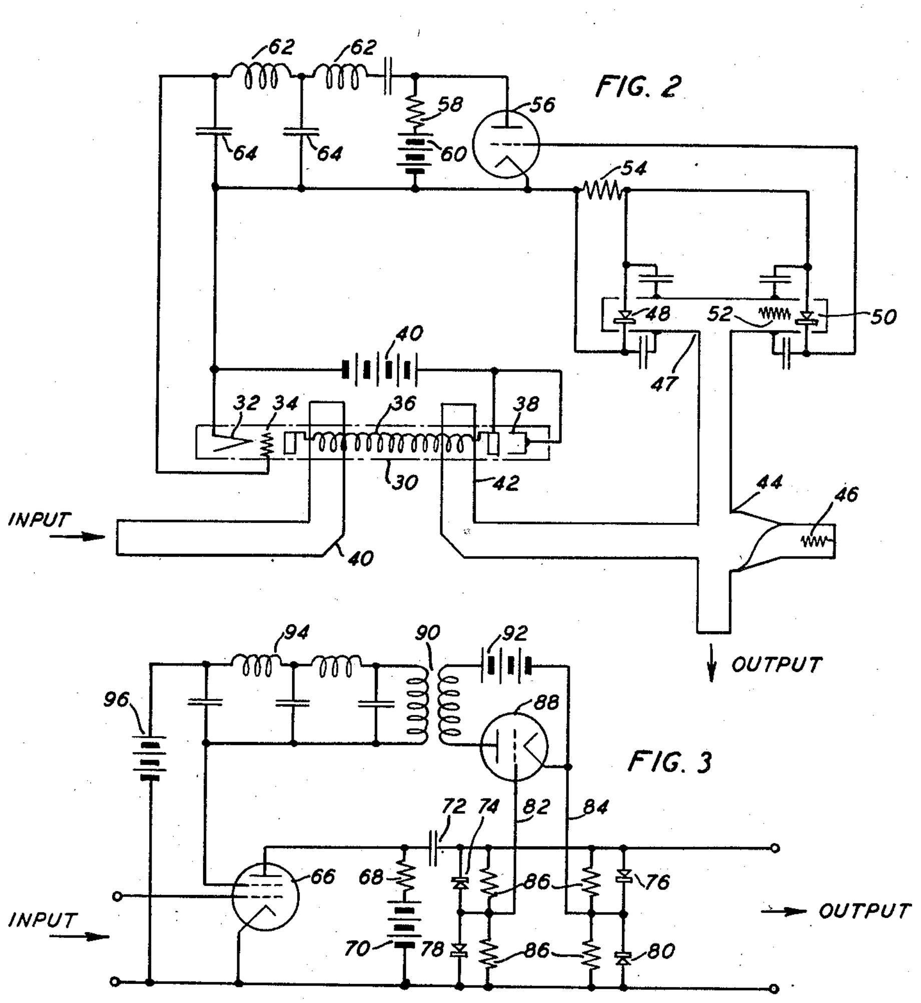
Fig. 2 is a schematic diagram illustrating the application of the invention for controlling the gain of a traveling wave tube amplifier operating at microwave frequencies.
Fig. 3 is a schematic diagram illustrating a modification of the invention for use in controlling the gain of an amplifier for direct current pulses.

The application of the invention to a microwave pulse amplifier employing a traveling wave tube is illustrated in Fig. 2. Here the traveling wave amplifier 30 includes a cathode 32, a control grid 34, a helix 36, and a collector 38 together with wave guide input and output circuits 40 and 42 respectively. Such traveling wave amplifiers are described in detail in the Proceedings of the Institute of Radio Engineers for February 1947 in the following articles: "Traveling Wave Tubes" by J. R. Pierce and L. M. Field, pages 108 through 111; "Theory of the Beam Type Traveling Wave Tubes" by J. R. Pierce, pages 111 through 123; and "The Traveling Wave Tube as Amplifier at Microwaves" by R. Kompfuer, pages 124 through 127. Appropriate operating potentials are applied between the cathode and helix at the cathode and collector by a suitable power supply shown herein schematically as a battery 40.

Output signals from the traveling wave tube 30 are applied through output wave guide 42 to the input arm of a hybrid junction 44. The arm conjugate to the input arm of the junction is terminated by a matching impedance 46 while the signal output is obtained from one of the remaining pairs of arms. The fourth arm is connected to a wave guide T 47 across the respective arms of which are connected crystal rectifiers 48 and 50 corresponding to impedances 16 and 18 of Fig. 1. It is well known that non-linear devices such as crystal rectifiers present essentially square-law characteristics at low amplitude levels and linear or at least widely different characteristics at higher levels. Thus rectifier 50 which operates at low levels because of attenuator 52 and rectifier 48 which operates at high levels present the required different characteristics. As shown in Fig. 2 these rectifiers may be connected to the wave guide arms in which they are mounted through capacitors which complete the high frequency circuits without causing a direct-current short circuit. Alternatively the crystal elements may be mounted in holders supported externally of the wave guide and provided with probes extending into the wave guide. An attenuator indicated schematically at 52 is provided in the arm of the T in which crystal 50 is mounted while an attenuator 54 is connected in the output circuit of the other crystal rectifier. The outputs from crysals 48 and 50 are applied in opposition between the cathode and grid elements of a conventional triode amplifier 56.

The output of the amplifier, appearing across load resistor 58 connected in series with power supply battery 60 between the anode and cathode of tube 56, is applied to a phase shifter indicated herein as comprising a delay line having series inductors 62 and shunt capacitors 64. The output of this delay line is of the proper phase to correspond to the time of the next expected input pulse and is applied between the control grid 34 and the cathode 32 of a traveling wave tube and increases the gain thereof for the incoming pulse, the phase reversal in amplifier 56 being effective to provide a control signal of the necessary polarity as in the case of Fig. 1.

As illustrated in Fig. 3, the invention is also applicable to amplifier circuits for so-called direct current pulses. As shown in this figure, input pulses are applied between the control grid and cathode of a tetrode amplifier tube 66, the anode circuit of which includes a load resistor 68 and a battery 70. The amplified pulse output from tetrode 66 is applied through a capacitor 72 to the input of a non-linear rectifier, the arms of which include rectifier elements 74, 76, 78 and 80. Of these elements, rectifiers 74 and 80 are poled as to present high resistances while rectifiers 76 and 78 are poled to present low resistances to signals applied to the input diagonal of the bridge. It will be understood therefore that the rectifier bridge is normally unblanced with the result that an output appears between leads 82 and 84 connected across the output diagonal of the bridge. The bridge is balanced at a particular input signal level and preferably at the level corresponding to the maximum input signal to be accepted by amplifier 66 by connecting in shunt of rectifier elements 74, 76, 78 and 80 resistors 86 which are so proportioned as to make the resistances in the four arms of the bridge equal at the chosen signal level. At any other input level the bridge is unbalanced and an output appears between leads 82 and 84.

The output of the bridge is applied to the input of a triode amplifier tube 88, output lead 82 being connected to the grid and output lead 84 to the cathode thereof. The anode of amplifier 88 is connected through the primary winding of a coupling transformer 90 to the positive terminal of anode supply battery 92, the negative terminal of which is connected to the cathode of the tube. A delay line 94 corresponding to the delay line shown in Fig. 2 is connected across the secondary winding of transformer 90 and the output of the line is applied as a gain control voltage in series with battery 96 between the screen grid and the cathode of signal amplifier 66.

Operation of the circuit shown in Fig. 3 is analogous in all respects to that of the previously described circuits of Figs. 1 and 2, the only difference being that no rectification is required in the automatic gain control loop since only direct current pulses appear at the output of signal amplifier 66.

What is claimed is:

1. An automatic gain control circuit for a broad band pulse amplifier arranged to transmit periodic pulses of fixed pulse interval comprising a pair of non-linear impedance elements having characteristics which coincide only at a particular signal level, means for applying the output pulses from said amplifier to each of said impedances, means for combining the output signals from said impedances in phase opposition, and means for applying the output of said combining means to control the gain of said amplifier, said last-mentioned means introducing a phase delay to make the total phase delay in the circuit including said impedances and said combining means substantially equal to the pulse interval.

2. An automatic gain control circuit for a broad band amplifier for periodic pulses of fixed pulse interval comprising a pair of non-linear elements having impedance characteristics which coincide at only one signal level, means for applying the output signal from the amplifier to each of said impedances, means for combining the output of said impedances in phase opposition, an amplifier for said combined outputs having a band width which is narrow as compared with the band width of said pulse amplifier to produce an alternating current signal for application to control the gain of the pulse amplifier as a function of the strength of the amplified signals, and a delay element connected in said automatic gain control circuit to make the total phase delay between the output of the pulse amplifier and the control signal applied thereto equal to said pulse interval.

3. An automatic gain control circuit comprising a traveling wave amplifier arranged for the transmission of radio frequency pulses and comprising an electron gun, a helix and a collector anode, a pair of non-linear impedances having impedance values which are the same in only a particular signal level, means for applying the output pulses from said traveling wave tube to said impedances, means for obtaining a control signal proportional to the difference between the outputs of said impedances, and means for applying said control signal to the electron gun of said traveling wave tube after a total delay equal to the pulse interval to vary the gain of said traveling wave tube.

References Cited in the file of this patent

UNITED STATES PATENTS

| | | |
|---|---|---|
| 2,096,793 | Doba | Oct. 26, 1937 |
| 2,135,953 | Weber | Nov. 8, 1938 |
| 2,212,713 | Wheeler | Aug. 20, 1940 |
| 2,305,543 | McCarty | Dec. 15, 1942 |
| 2,329,558 | Scherbatsloy | Sept. 14, 1943 |
| 2,342,238 | Barney | Feb. 22, 1944 |
| 2,346,020 | Gillespie | Apr. 4, 1944 |
| 2,363,813 | Somers | Nov. 28, 1944 |
| 2,429,227 | Herbst | Oct. 21, 1947 |
| 2,508,677 | Loper | May 23, 1950 |
| 2,554,458 | Graham | May 22, 1951 |
| 2,554,905 | Hawkins et al. | May 29, 1951 |
| 2,585,890 | Wolfe | Feb. 12, 1952 |